US008743584B2

(12) United States Patent
Fukuzumi et al.

(10) Patent No.: US 8,743,584 B2
(45) Date of Patent: Jun. 3, 2014

(54) SHIFT REGISTER MEMORY AND DRIVING METHOD THEREOF

(75) Inventors: Yoshiaki Fukuzumi, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 13/599,228

(22) Filed: Aug. 30, 2012

(65) Prior Publication Data

US 2013/0242634 A1 Sep. 19, 2013

(30) Foreign Application Priority Data

Mar. 13, 2012 (JP) ................................. 2012-056242

(51) Int. Cl.
*G11C 19/00* (2006.01)
*G11C 19/08* (2006.01)
*G11C 11/00* (2006.01)
*G11C 11/14* (2006.01)
*G11C 11/15* (2006.01)
*H01L 29/82* (2006.01)
*G11C 11/16* (2006.01)

(52) U.S. Cl.
CPC ................ *G11C 11/14* (2013.01); *G11C 11/15* (2013.01); *G11C 11/16* (2013.01)
USPC .................. 365/80; 365/85; 365/87; 365/158; 365/171; 365/173; 257/421; 257/E21.665; 257/E29.323

(58) Field of Classification Search
CPC ....................................................... G11C 11/14
USPC ........................................................... 365/80
See application file for complete search history.

(56) References Cited

U.S. PATENT DOCUMENTS

| 7,031,178 | B2 * | 4/2006 | Parkin ............................ 365/80 |
| 7,108,797 | B2 * | 9/2006 | Chen et al. ..................... 216/22 |
| 7,236,386 | B2 * | 6/2007 | Parkin ............................ 365/80 |
| 7,855,908 | B2 * | 12/2010 | Joe et al. ......................... 365/85 |
| 7,936,597 | B2 * | 5/2011 | Clinton et al. ................. 365/173 |
| 8,045,371 | B2 | 10/2011 | Lee et al. |
| 8,050,074 | B2 * | 11/2011 | Kim et al. ...................... 365/80 |
| 8,102,691 | B2 * | 1/2012 | Xi et al. .......................... 365/81 |
| 8,279,653 | B2 * | 10/2012 | Tsai et al. ....................... 365/80 |
| 8,339,728 | B2 * | 12/2012 | Kim et al. ....................... 360/80 |
| 2008/0080234 | A1 * | 4/2008 | Iwata et al. .................... 365/171 |
| 2010/0128510 | A1 | 5/2010 | Cowburn |
| 2010/0232055 | A1 | 9/2010 | Lee et al. |
| 2011/0267868 | A1 | 11/2011 | Fukuzumi et al. |
| 2013/0250668 | A1 * | 9/2013 | Fukuzawa et al. ............ 365/158 |

FOREIGN PATENT DOCUMENTS

| JP | 2005-123488 | 5/2005 |
| JP | 2006-237183 | 9/2006 |
| JP | 2010-218678 | 9/2010 |

* cited by examiner

*Primary Examiner* — Son Mai
(74) *Attorney, Agent, or Firm* — Oblon, Spivak, McClelland, Maier & Neustadt, L.L.P.

(57) ABSTRACT

A shift register memory according to the present embodiment includes a magnetic pillar including a plurality of magnetic layers and a plurality of nonmagnetic layers provided between the magnetic layers adjacent to each other. A stress application part applies a stress to the magnetic pillar. A magnetic-field application part applies a static magnetic field to the magnetic pillar. The stress application part applies the stress to the magnetic pillar in order to transfer magnetization states of the magnetic layers in a stacking direction of the magnetic layers.

20 Claims, 12 Drawing Sheets

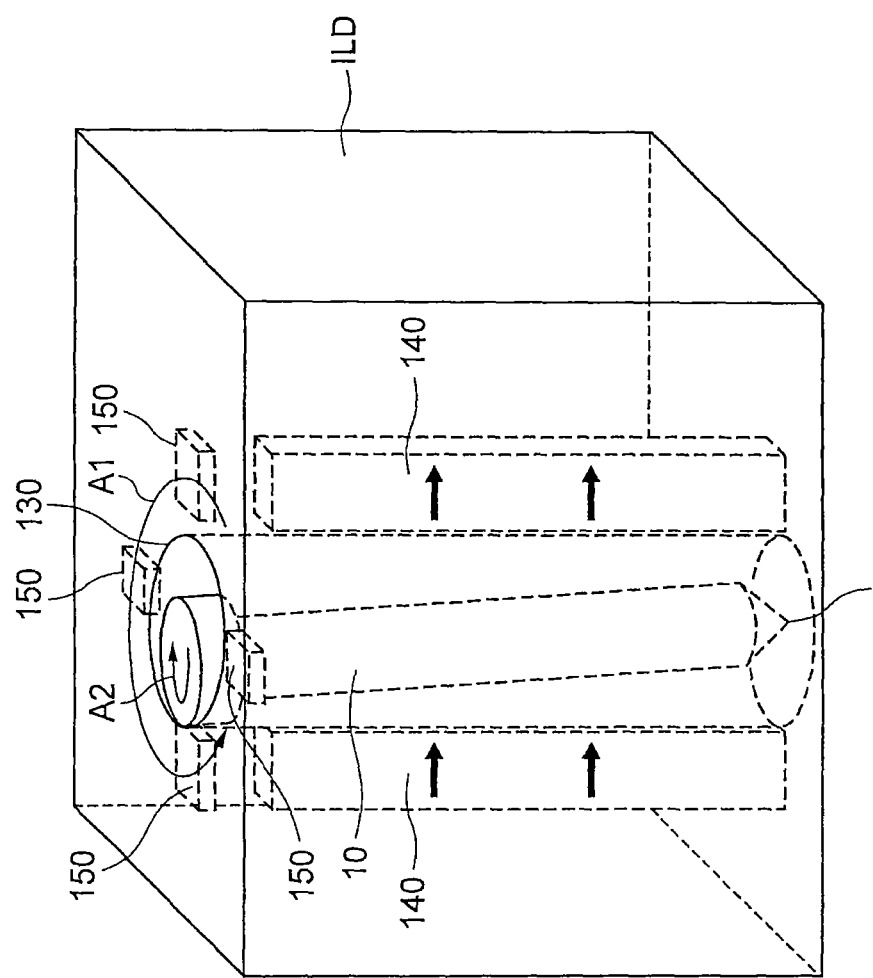

US 8,743,584 B2

SHIFT REGISTER MEMORY AND DRIVING METHOD THEREOF

CROSS REFERENCE TO RELATED APPLICATIONS

This application is based upon and claims the benefit of priority from the prior Japanese Patent Application No. 2012-056242, filed on Mar. 13, 2012, the entire contents of which are incorporated herein by reference.

FIELD

The embodiments of the present invention relate to a shift register memory and driving method thereof.

BACKGROUND

A shift register memory has been proposed as a method of realizing a large capacity of a memory. The shift register memory includes magnetic pillars each configured by a plurality of ferromagnetically coupled magnetic layers, and stores data according to magnetization directions of the magnetic layers. The data in the magnetic pillars are possibly sequentially transferred to sensors or wires by applying a rotating magnetic field to the magnetic pillars.

However, if the memory is downscaled and a diameter of each magnetic pillar is reduced, it is required to increase the rotating magnetic field so as to maintain its data retention. In this case, a very high current is disadvantageously necessary so as to generate the rotating magnetic field.

BRIEF DESCRIPTION OF THE DRAWINGS

FIG. 12 is a perspective view showing a configuration of a shift register memory according to a third embodiment.

DETAILED DESCRIPTION

A shift register memory according to the present embodiment includes a magnetic pillar including a plurality of magnetic layers and a plurality of nonmagnetic layers provided between the magnetic layers adjacent to each other. A stress application part applies a stress to the magnetic pillar. A magnetic-field application part applies a static magnetic field to the magnetic pillar. The stress application part applies the stress to the magnetic pillar in order to transfer magnetization states of the magnetic layers in a stacking direction of the magnetic layers.

Embodiments will now be explained with reference to the accompanying drawings. The present invention is not limited to the embodiments.

First Embodiment

Figure 1:
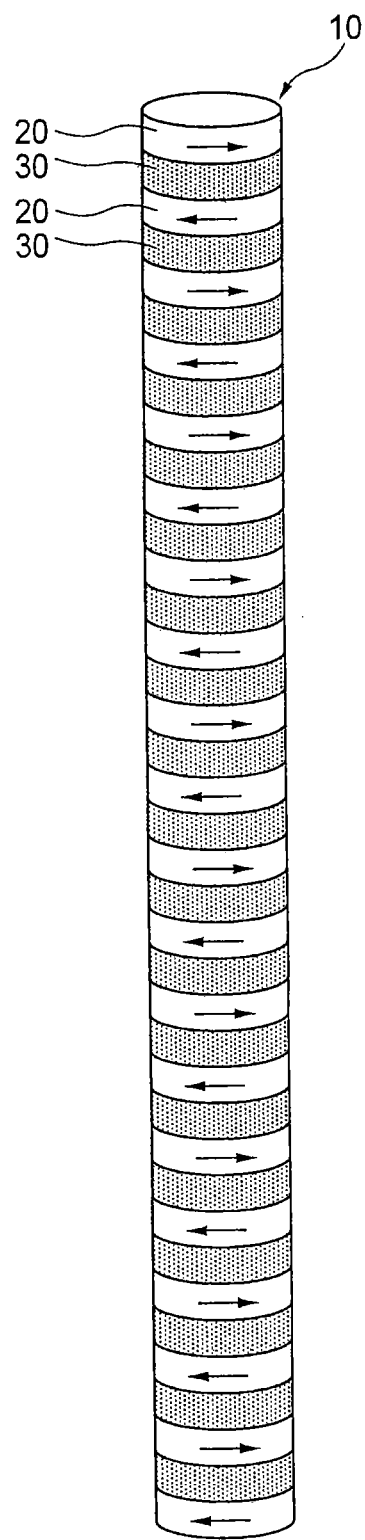
FIG. 1 shows a configuration of a magnetic pillar 10 according to a first embodiment.

FIG. 1 shows a configuration of a magnetic pillar 10 according to a first embodiment. The magnetic pillar 10 includes a plurality of magnetic layers 20 and a plurality of nonmagnetic layers 30, and is formed by alternately stacking the magnetic layers 20 and the nonmagnetic layers 30. Each of the magnetic layers 20 is formed using a material that has an inverse magnetostriction effect such as a Ni film. Each of the nonmagnetic layers 30 is formed using a non-magnetic conductive film such as a Ru film.

Each magnetic layer 20 is formed to be small enough to include a single magnetic domain. Each magnetic layer 20 thereby has a single magnetization state (a magnetic moment).

The two magnetic layers 20 adjacent to each other are antiferromagnetically coupled (so-called SAF (Synthetic Antiferromagnet) coupling) and have anti-parallel magnetic moments by a dipole field in stable states. The two magnetic layers 20 adjacent to each other can store binary states (data "0" or data "1") in proportion to directions of the magnetic moments, respectively. The magnetic pillar 10 can store much bit data by including many magnetic layers 20.

Figure 2:
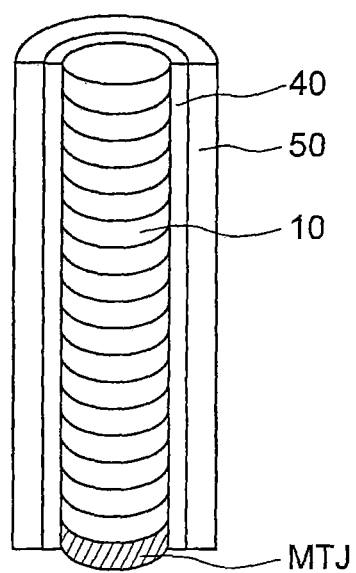
FIG. 2 shows configurations of the magnetic pillar 10, a diffusion prevention film 40, and a stress application film 50.

FIG. 2 shows configurations of the magnetic pillar 10, a diffusion prevention film 40, and a stress application film 50. The stress application film 50 is provided to surround the magnetic pillar 10 so as to be able to apply a stress to the magnetic pillar 10. The stress application film 50 is formed using, for example, a ferroelectric material such as AlN. The diffusion prevention film 40 is provided between the magnetic pillar 10 and the stress application film 50 so that the materials of the magnetic pillar 10 and that of the stress application film 50 do not mutually diffuse. The diffusion prevention film 40 is formed using, for example, a paraelectric film such as $SiO_2$, SiN, or $Al_2O_3$ or metal or a metal compound such as TiN, Ta, or TaN.

An STT-MTJ (Spin Transfer Torque-type Magnetic Tunnel Junction) element is provided on a lower end of the magnetic pillar 10. For example, one nonmagnetic layer 30 is provided as a lowermost layer of the magnetic pillar 10, and a ferromagnetic layer, a nonmagnetic insulating film, and a ferromagnetic layer that constitute the MTJ element are provided under the nonmagnetic layer 30. The MTJ element functions as a sense element that detects the magnetization states (data) transferred within the magnetic pillar 10. For example, the magnetization states are sequentially transferred in a direction of the MTJ element within the magnetic pillar 10, and the MTJ element detects the magnetization states.

The STT-MTJ element has a stacked structure configured by the two ferromagnetic layers and the nonmagnetic insulating film sandwiched between the ferromagnetic layers, and stores digital data according to a change in a magnetic resistance due to the spin-polarized tunneling effect. The STT-MTJ element can be made into a low resistance state or a high resistance state according to magnetization arrangements of the two ferromagnetic layers. When the magnetization arrangements of the two ferromagnetic layers are in a parallel state (P state), the MTJ element is in the low resistance state. When the magnetization arrangements of the two ferromagnetic layers are in an anti-parallel state (AP state), the MTJ element is in the high resistance state.

Figure 3:
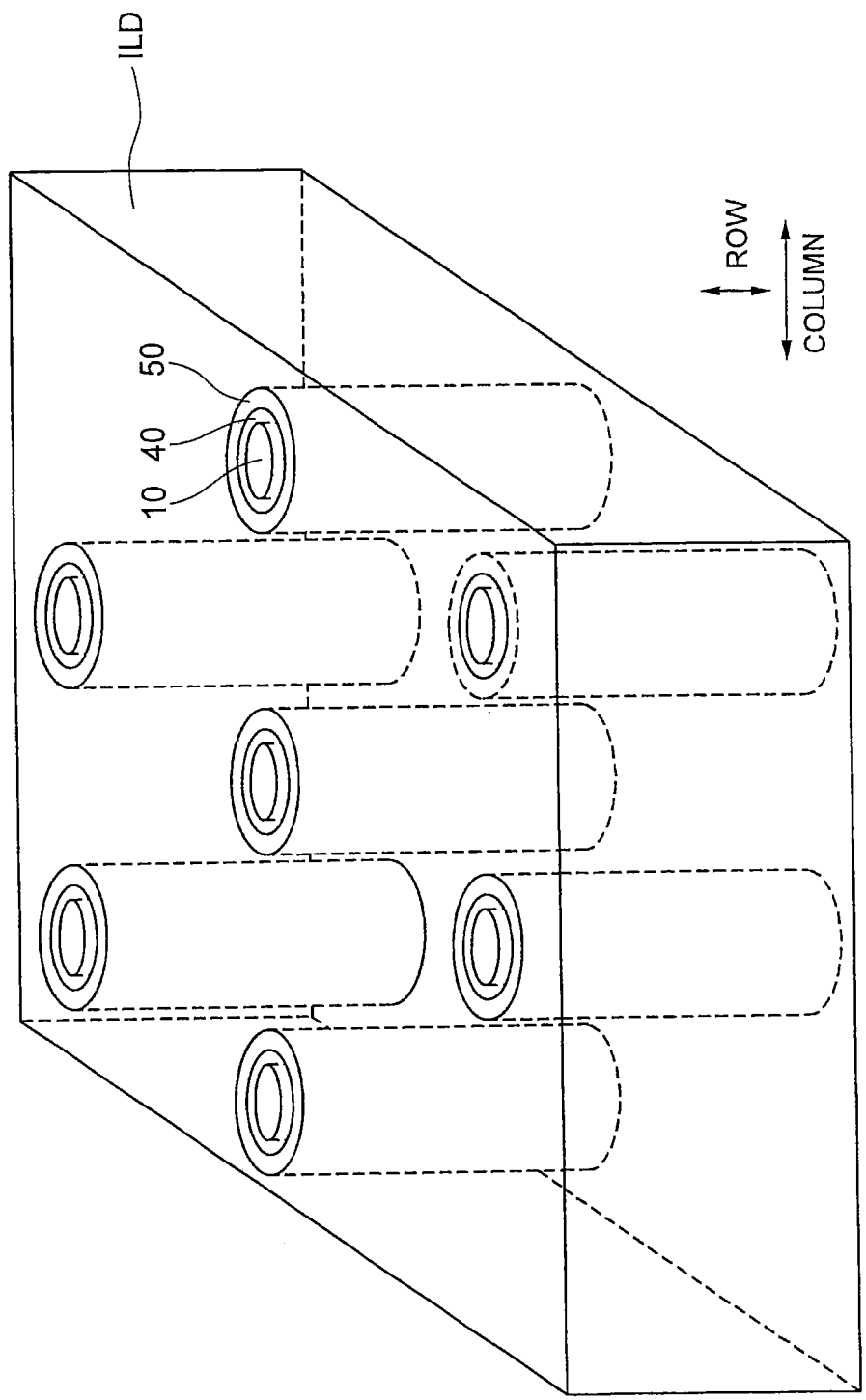
FIG. 3 is a perspective view showing an exemplary geometry of a plurality of magnetic pillars 10.

FIG. 3 is a perspective view showing an exemplary geometry of a plurality of magnetic pillars 10. The magnetic pillars 10 are arranged two-dimensionally in an array. The magnetic pillars 10 are arrayed in a column direction and constitute a plurality of columns. In the first embodiment, the columns of the magnetic pillars 10 adjacent in a row direction are arranged to be half-pitch staggered in the column direction. A planar layout of the magnetic pillars 10 is described later.

An interlayer dielectric film ILD is provided to surround the stress application film 50, and is filled among the magnetic pillars 10. By filling the interlayer dielectric film ILD among the magnetic pillars 10, expansion or contraction of the stress application film 50 can be applied to each of the magnetic pillars 10 as a stress.

When the stress application film 50 applies the stress to each of the magnetic pillars 10, directions of magnetic anisotropy of the respective magnetic layers 20 within the magnetic pillar 10 are changed. In other words, when the stress application film 50 applies the stress to the magnetic pillar 10, easy directions of magnetization (directions in which the magnetic moments are easy to orient) of the respective magnetic layers 20 within the magnetic pillar 10 are changed.

FIGS. 4A to 4E are explanatory diagrams showing relations between the stress applied to each magnetic pillar 10 and the easy directions of magnetization of the magnetic layers 20. A shift register memory according to the first embodiment controls the easy directions of magnetization of the magnetic layers 20 by applying a static magnetic field in a fixed direction to the magnetic pillar 10 and changing a direction of the stress applied to the magnetic pillar 10. The shift register memory can thereby shift the magnetization state (the magnetic moment) of one certain magnetic layer 20 to the next magnetic layer 20 adjacent to the certain magnetic layer 20 within the magnetic pillar 10.

According to the conventional technique, the magnetization state of each of the magnetic layers is transferred by rotating the magnetic field applied to the magnetic pillar (that is, using the rotating magnetic field).

According to the first embodiment, by contrast, the magnetization state of each of the magnetic layers 20 is transferred within each magnetic pillar 10 by fixing the magnetic field and changing the direction of the stress applied to the magnetic pillar 10. The static magnetic field from a magnetic-field application part can be applied to the magnetic pillar 10 by arranging a permanent magnet inside or outside of a memory chip. Alternatively, the static magnetic field can be applied to the magnetic pillar 10 by using a magnetic insulating film (an iron oxide film, for example) or a permanent magnet for the interlayer dielectric film ILD that serves as the magnetic-field application part. In this alternative, the magnetic insulating film (or the permanent magnet) is filled among the adjacent magnetic pillars 10. Although an electromagnet can be used as the magnetic-field application part, it is preferable to use the magnetic insulating film or the permanent magnet so as to suppress current consumption.

For example, as shown in FIGS. 4A to 4E, the static magnetic field is applied to the magnetic pillar 10 so as to be substantially orthogonal to a direction of crystal magnetic anisotropy Dcma. Dsmf denotes a direction of the static magnetic field. Dst denotes a direction of the stress applied from the stress application film 50 to the magnetic pillar 10. Dsma denotes a direction of synthetic magnetic anisotropy between the crystal magnetic anisotropy (Dcma) and anisotropy induced by an inverse magnetostriction effect produced by the stress. The direction of the synthetic magnetic anisotropy Dsma indicates an actual easy direction of magnetization when the stress is applied to the magnetic layer 20 that has certain crystal magnetic anisotropy.

Figure 4:
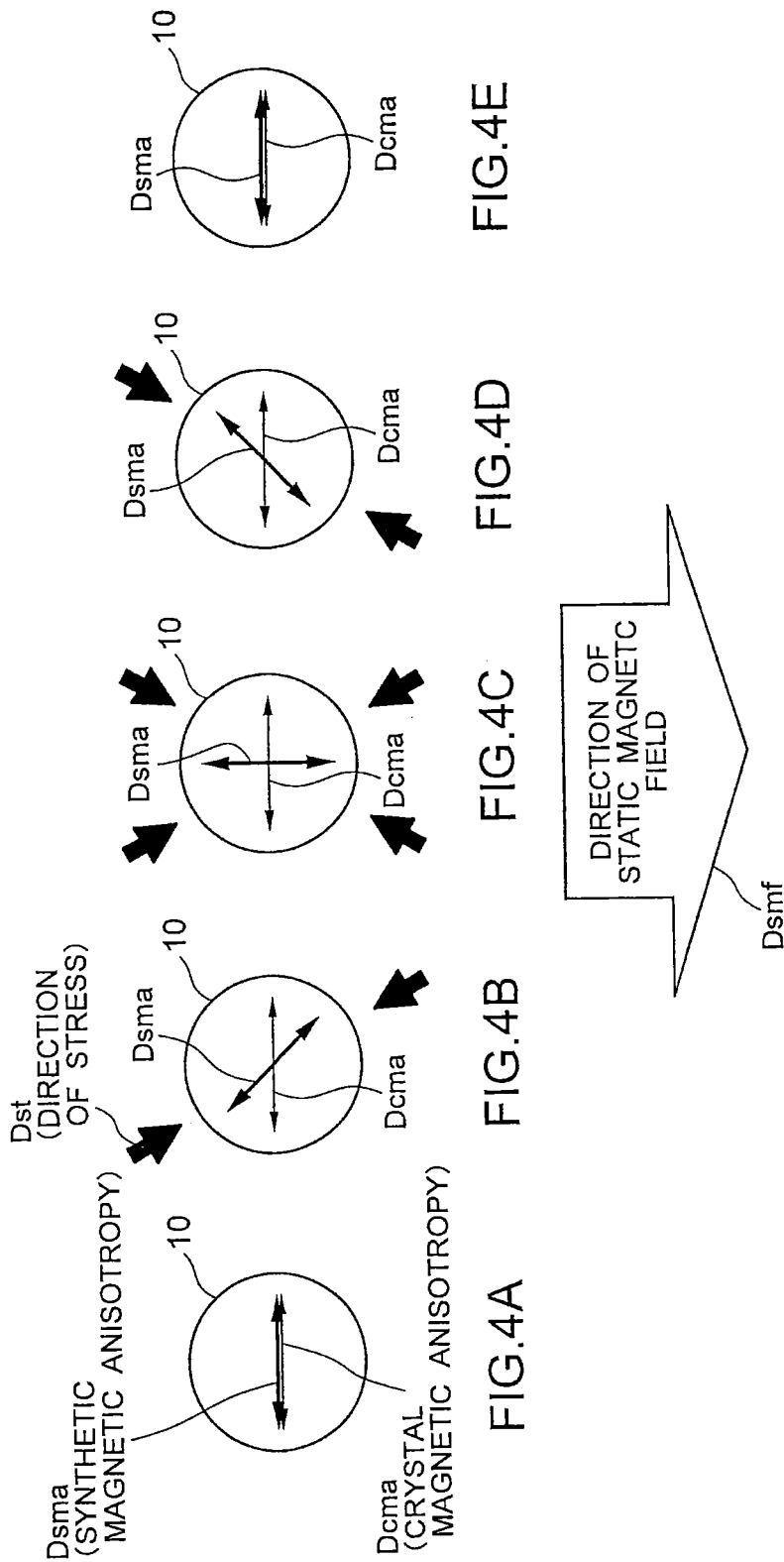
FIGS. 4A to 4E are explanatory diagrams showing relations between the stress applied to each magnetic pillar 10 and the easy directions of magnetization of the magnetic layers 20.

As shown in FIG. 4A, when the stress application film 50 does not apply the stress to the magnetic pillar 10, the direction of the synthetic magnetic anisotropy Dsma substantially matches the direction of the crystal magnetic anisotropy Dcma.

As shown in FIG. 4B, when the stress application film 50 applies the stress to the magnetic pillar 10 from one direction inclined with respect to the direction of the crystal magnetic anisotropy Dcma and the direction of the static magnetic field Dsmf, the direction of the synthetic magnetic anisotropy Dsma is rotated so as to be closer to the direction of the stress application Dst.

As shown in FIG. 4C, when the stress application film 50 applies the stress from two directions inclined with respect to the direction of the crystal magnetic anisotropy Dcma and the direction of the static magnetic field Dsmf, the direction of the synthetic magnetic anisotropy Dsma is rotated so as to be substantially orthogonal to the direction of the crystal magnetic anisotropy Dcma.

As shown in FIG. 4D, when the stress application film 50 applies the stress from another direction inclined with respect to the direction of the crystal magnetic anisotropy Dcma and the direction of the static magnetic field Dsmf, the direction of the synthetic magnetic anisotropy Dsma is rotated so as to be closer to the direction of the stress application Dst.

Furthermore, as shown in FIG. 4E, when the stress application film 50 stops applying the stress to the magnetic pillar 10, the direction of the synthetic magnetic field Dsma matches the direction of the crystal magnetic anisotropy Dcma again. That is, the direction of the synthetic magnetic anisotropy Dsma is rotated by half with respect to the direction of the crystal magnetic anisotropy Dcma.

By repeating operations shown in FIGS. 4A to 4E again, it is possible to fully rotate the direction of the synthetic magnetic anisotropy (that is, the easy direction of magnetization) Dsma of the magnetic layer 20 once with respect to the direction of the static magnetic field Dsmf.

In this way, the stress application film 50 can rotate the easy direction of magnetization of each of the magnetic layers 20 within the magnetic pillar 10 by the inverse magnetostriction effect generated by applying the stress to the magnetic pillar 10. That is, according to the first embodiment, it is possible to rotate the direction of the magnetic anisotropy (the easy direction of magnetization) of each of the magnetic layers 20 with respect to the static magnetic field by applying the stress to the magnetic pillar 10 even if the direction of the static magnetic field Dsmf is fixed.

Figure 5:
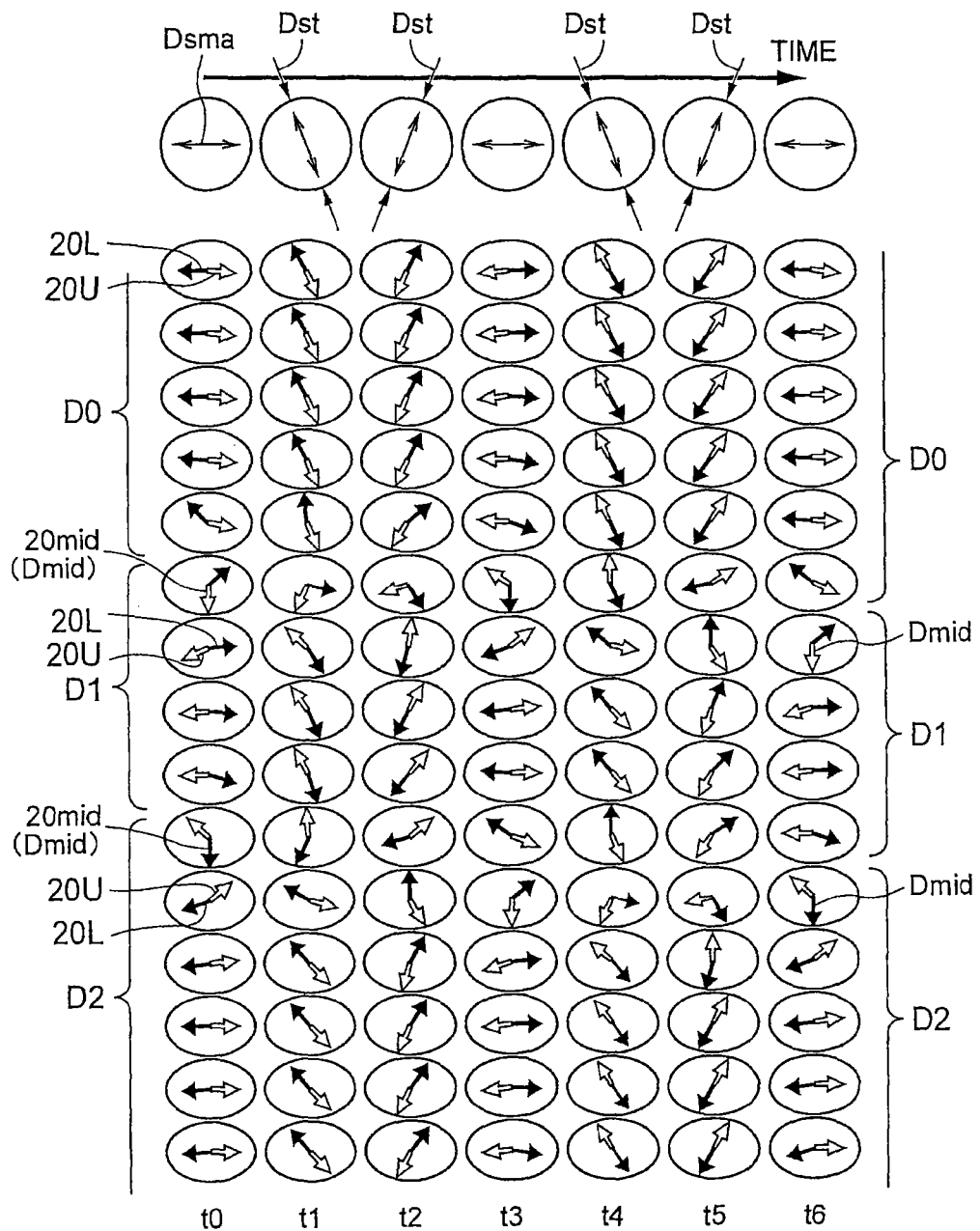
FIG. 5 is a conceptual diagram showing an operation for transferring the magnetic moments within the magnetic pillar 10.

FIG. 5 is a conceptual diagram showing an operation for transferring the magnetic moments within the magnetic pillar 10. The direction of the synthetic magnetic anisotropy Dsma and the direction of the stress application Dst are shown on the top part of FIG. 5. Directions of the magnetic moments of the magnetic layers 20 within the magnetic pillar 10 are shown under the direction of the synthetic magnetic anisotropy Dsma and the direction of the stress application Dst. Arrows of two magnetic moments shown in one circle indicate the directions of the magnetic moments of the two adjacent magnetic layers 20, respectively. Because the paired magnetic layers 20 are antiferromagnetically coupled, the magnetic layers 20 are stable by being basically oriented in the opposite directions.

For example, it is assumed that an outlined arrow indicates an upper magnetic layer 20U and that a black arrow indicates a lower magnetic layer 20L. In this case, as for data D0, the upper magnetic layers 20U have the magnetic moments in a right direction and the lower magnetic layers 20L have the magnetic moments in a left direction. On the other hand, as for data D1, the upper magnetic layers 20U have the magnetic moments in the left direction and the lower magnetic layers 20L have the magnetic moments in the right direction. Furthermore, as for data D2, similarly to the data D0, the upper magnetic layers 20U have the magnetic moments in the right direction and the lower magnetic layers 20L have the magnetic moments in the left direction. The data D2 is identical in logic to the data D0.

The data D0, D1, and D2 are kept in stable magnetic states per se. However, a magnetic layer 20mid having a magnetic moment Dmid in an intermediate state is present between the data opposite in the logic. Therefore, at least the paired magnetic layers 20 that are antiferromagnetically coupled and the magnetic layer 20mid having the magnetic moment Dmid store one-bit data. That is, at least the three consecutive magnetic layers 20 store one-bit data. Needless to say, four or more consecutive magnetic layers 20 can store one-bit data.

At a time t0 shown in FIG. 5, no stress is applied. Therefore, the direction of the synthetic magnetic anisotropy Dsma substantially matches the direction of the crystal magnetic anisotropy Dcma.

At a time t1, when the stress is applied from the direction Dst inclined with respect to the direction of the crystal magnetic anisotropy Dcma, the direction of the synthetic magnetic anisotropy Dsma is also rotated in the same direction as the direction of the stress application Dst. As indicated by the column at the time t1 shown in FIG. 5, the magnetic moment of each magnetic layer 20 is thereby rotated according to the direction of the synthetic magnetic anisotropy (the easy direction of magnetization) Dsma.

At a time t2, when the direction of the stress application Dst is further rotated, the direction of the synthetic magnetic anisotropy Dsma is also rotated in the same direction as the direction of the stress application Dst. As indicated by the column at the time t2 shown in FIG. 5, the magnetic moment of each magnetic layer 20 is thereby rotated according to the direction of the synthetic magnetic anisotropy (the easy direction of magnetization) Dsma.

At a time t3, when the direction of the stress application Dst is rotated by half, the magnetic moments of the antiferromagnetically coupled paired magnetic layers 20 are reversed.

Furthermore, at a time t4 to a time t6 when the direction of the stress application Dst is rotated by half, the magnetic moments of the antiferromagnetically coupled paired magnetic layers 20 are further reversed. Therefore, as a result of operations from the time t0 to the time t6, the magnetic moments of the paired magnetic layers 20 are fully rotated once. At this time, the magnetic moments of the magnetic layers 20 are shifted by as much as the magnetic moments of the paired magnetic layers 20. That is, by fully rotating the direction of the stress application Dst once, the data D0 to the data D2 are transferred by as much as the paired magnetic layers 20. This can be easily understood by comparing positions of the data D0 to the data D2 within the magnetic pillar 10 at the time t0 with those of the data D0 to the data D2 within the magnetic pillar 10 at the time t6 in FIG. 5.

In this way, the shift register memory according to the first embodiment can sequentially transfer the data D0 to the data D2 within the magnetic pillar 10 in a stacking direction of the magnetic layers 20 by rotating the direction of the stress application Dst.

The stress can be applied based on the direction of the crystal magnetic anisotropy Dcma. For example, the stress can be applied at an angle of 60 degrees with respect to the direction of the crystal magnetic anisotropy Dcma at the time n, an angle of 120 degrees with respect to the direction of the crystal magnetic anisotropy Dcma at the time t2, an angle of 60 degrees (240 degrees) with respect to the direction of the crystal magnetic anisotropy Dcma at the time t4, and an angle of 120 degrees (300 degrees) with respect to the direction of the crystal magnetic anisotropy Dcma at the time t5. That is, it actually suffices to rotate the direction of the stress application Dst discretely although the direction of the stress application Dst can be rotated continuously from the direction of the crystal magnetic anisotropy Dcma. Even if the direction of stress application Dst is discretely rotated, it is sufficiently possible to rotate the magnetic moment of each magnetic layer 20.

Figure 6:
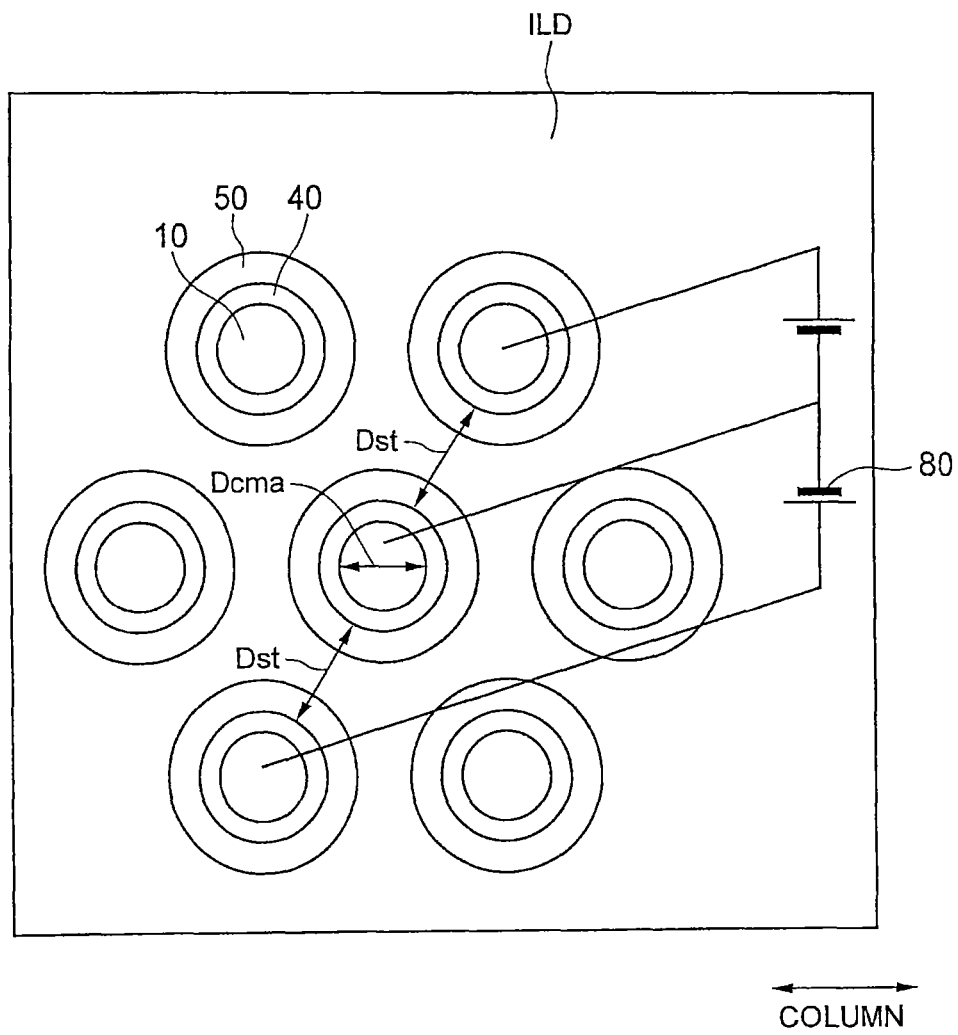
FIG. 6 is a conceptual diagram showing a stress application method.

FIG. 6 is a conceptual diagram showing a stress application method. A stress application driver 80 gives a voltage difference to the adjacent magnetic pillars 10. An electric field is thereby applied to the stress application films (ferroelectric films, for example) 50. As a result, the stress application films 50 expand or contract, and apply the stress to the respective magnetic pillars 10 in directions shown in FIG. 6. By changing the magnetic pillars 10 to which the voltage difference is given, the direction of the stress application Dst can be changed. For example, as shown in FIG. 6, when the magnetic pillars 10 are half-pitch staggered in the adjacent columns, the direction of the stress applications Dst can intersect the direction of the crystal magnetic anisotropy Dcma at angles of 60 degrees (240 degrees), 90 degrees (270 degrees), and 120 degrees (300 degrees) with respect to the direction of the crystal magnetic anisotropy Dcma.

Figure 7:
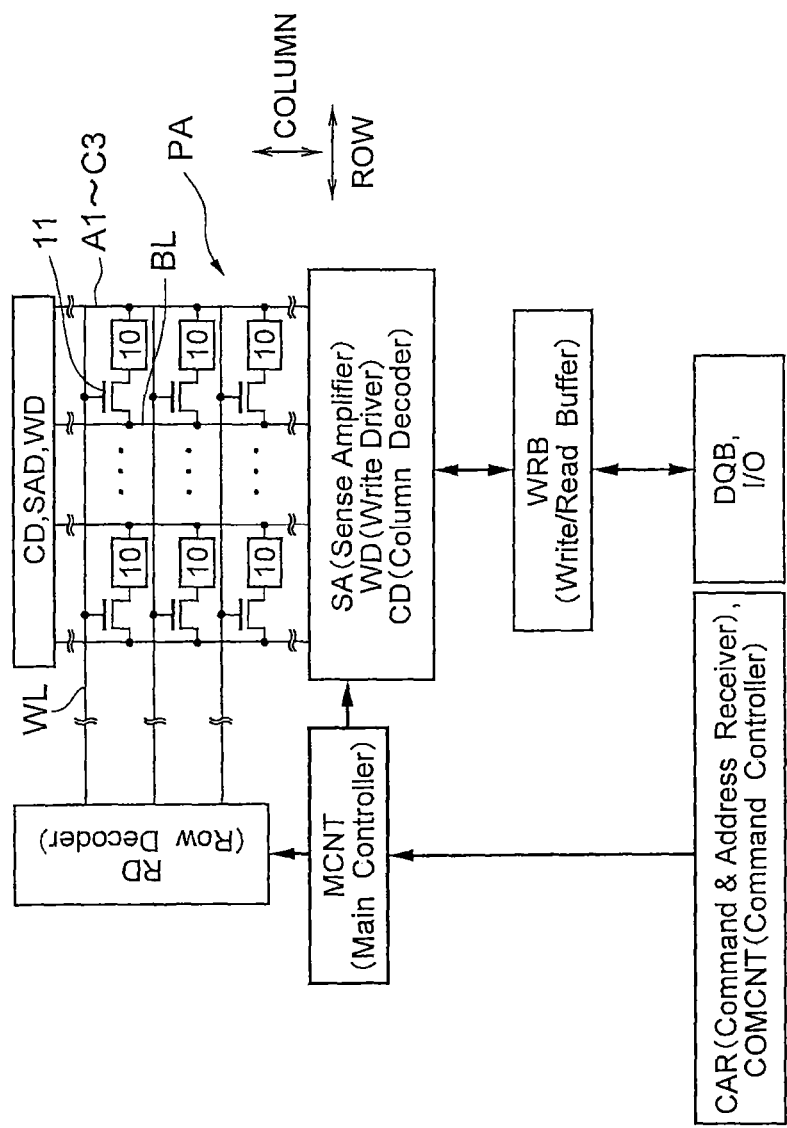
FIG. 7 is a block diagram showing a configuration of the shift register memory according to the first embodiment.

FIG. 7 is a block diagram showing a configuration of the shift register memory according to the first embodiment. The shift register memory according to the first embodiment includes a pillar array PA, a command/address receiver CAR, a command controller COMCNT, a data buffer DQB, and an input/output part I/O.

The pillar array PA includes the magnetic pillars 10 arranged two-dimensionally in a matrix above a semiconductor substrate. Each magnetic pillar 10 is connected to a bit line BL via a transistor 11, and directly connected to one of pillar wires A1 to C3. A gate of the transistor 11 is connected to a word line WL. That is, one end of the magnetic pillar 10 is connected to the bit line BL via the transistor 11 and the other end thereof is connected to any one of the pillar wires A1 to C3.

The shift register memory further includes sense amplifiers SA, a write driver WD, a column decoder CD, a row decoder RD, a stress application driver SAD, a main controller MCNT, and a write/read page buffer WRB.

Each of the sense amplifiers SA is connected to the magnetic pillars 10 via the corresponding bit line BL or one of the pillar wires A1 to C3, and detects the data stored in the MT) element present on the lower end of each magnetic pillar 10. The write driver WD is connected to the magnetic pillars 10 via the bit lines BL or the pillar wires A1 to C3, and writes data to each magnetic pillar 10.

The command/address receiver CAR receives commands, addresses, and clocks for determining an entire operation performed by the shift register memory. The command/address receiver CAR receives a bank address, a column address, a row address, and the like as the addresses. The pillar array PA can execute various operations in response to these commands, respectively.

The command controller COMCNT receives commands indicating various operations such as a read operation and a write operation, and controls the main controller MCNT in response to those commands, respectively.

The main controller MCNT controls the entire memory to transfer data received from the data buffer DQB to the write driver WD so as to write the data to the pillar array PA in response to the addresses, or to transfer data read from the pillar array PA in response to the addresses to the data buffer DQB.

The column decoder CD selects the bit line BL or one of the pillar wires A1 to C3 in a certain column in response to the column address. The row decoder RD selects one of the word lines WL in response to the row address.

The stress application driver SAD applies a voltage to one of the pillar wires A1 to C3 so as to apply the stress to one predetermined magnetic pillar 10.

The write/read page buffer WRB temporarily stores the write data input via the input/output part I/O and the data buffer DQB, or temporarily stores the read data from the magnetic pillars 10.

The data buffer DQB temporarily holds the read data so as to output the read data to the outside via the input/output part I/O, or temporarily holds the write data input from outside via the input/output part I/O so as to transfer the write data to the inside.

Figure 8:
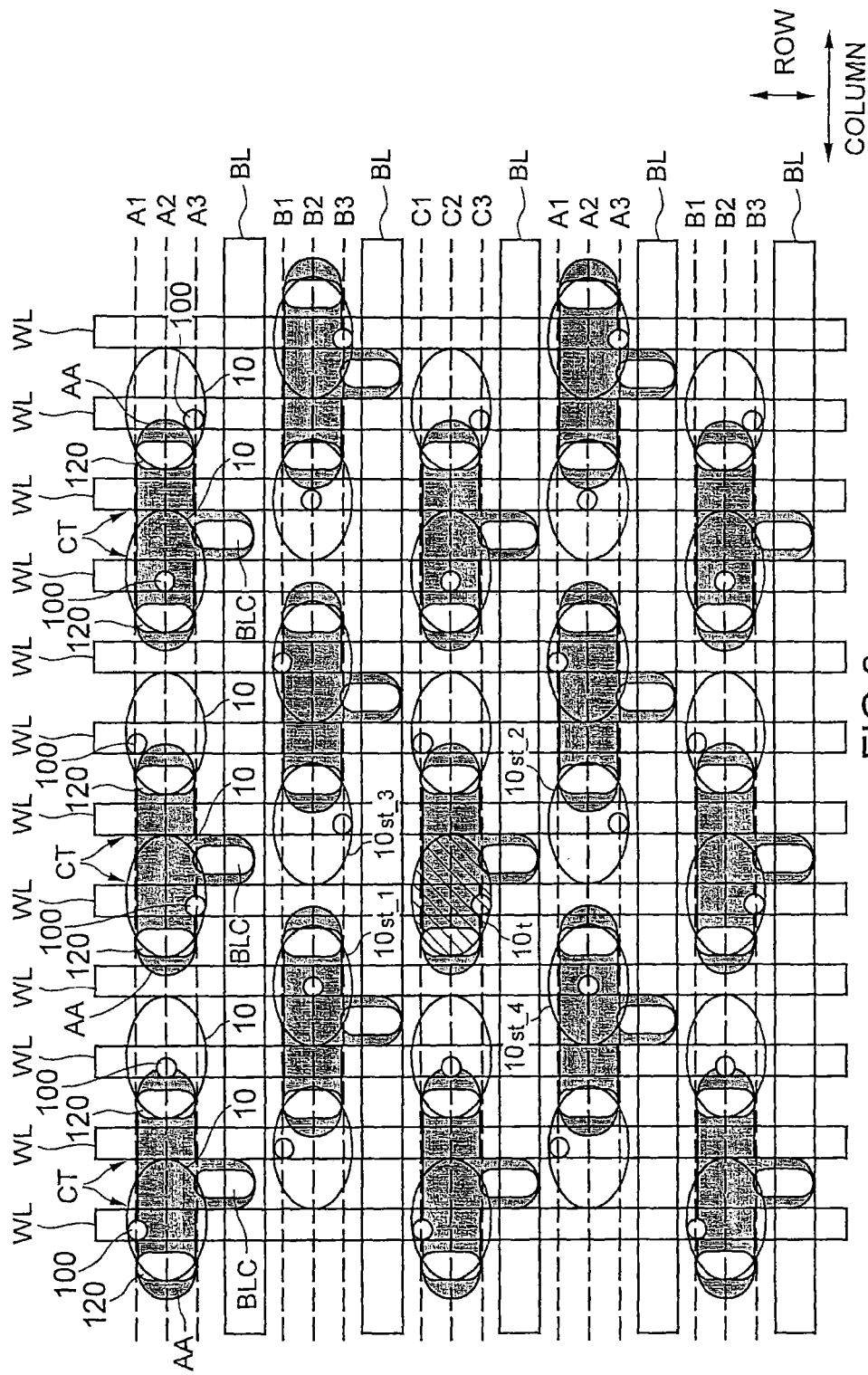
FIG. 8 is a plan view showing a layout of the shift register memory according to the first embodiment.

FIG. 8 is a plan view showing a layout of the shift register memory according to the first embodiment. A plurality of word lines WL extend in the row direction. A plurality of bit lines BL extend in the column direction orthogonal to the row direction.

A plurality of active areas AA insulated from one another are arranged two-dimensionally in an array. The active areas AA arrayed in the column direction constitute active area columns. In the column direction, a plurality of active area columns adjacent in the row direction are staggered by a half pitch of a total width of an active area AA and a space between two adjacent active areas AA, in the column direction. Each active area AA is laid out into a T-shape, and two cell transistors CT are provided in the active area AA. The two word lines WL adjacent to each other correspond to each active area AA, accordingly.

One end (a drain, for example) of each of the two cell transistors CT provided in one active area AA is commonly connected to one bit line BL via a bit line contact BLC. The other end (a source, for example) of each of the two cell transistors CT provided in the active area AA is connected via a contact 120 to the MTJ element present on the lower end of each magnetic pillar 10.

Each of the magnetic pillars 10 is electrically connected to one of pillar wires A1 to A3, B1 to B3, or C1 to C3 via a contact 100. The magnetic pillars 10 are arrayed in the column direction. In the column direction, the columns of the adjacent magnetic pillars 10 are staggered by the half pitch of a total wide of a magnetic pillar 10 and the space between two magnetic pillars 10 adjacent each other in the column direction. With this configuration, the magnetic pillars 10 are arranged to form triangle grids in the planar layout, as shown in FIG. 6. In other words, the six magnetic pillars 10 are arranged to surround one magnetic pillar 10.

The pillar wires A1 to A3, B1 to B3, and C1 to C3 indicated by broken lines in the column direction are provided to correspond to a plurality of contacts 100 (contact columns) arrayed in the column direction, respectively. The pillar wires A1 to A3, B1 to B3, and C1 to C3 are connected to the contacts 100 in the corresponding contact columns, respectively.

As for the magnetic pillars 10 arrayed in the row direction, connection positions of the contacts 100 are the same. As for the magnetic pillars 10 arrayed in the column direction, however, the connection positions of the contacts 100 are staggered in the row direction. For example, the contacts 100 are arranged at positions of intersections between the three magnetic pillars 10 continuously adjacent in the column direction and the three pillar wires A1 to A3 continuously adjacent in the row direction, respectively. Similarly, the contacts 100 are arranged at positions of intersections between the three magnetic pillars 10 continuously adjacent in the column direction and the three pillar wires B1 to B3 continuously adjacent in the row direction, respectively. Furthermore, the contacts 100 are arranged at positions of intersections between the three magnetic pillars 10 continuously adjacent in the column direction and the three pillar wires C1 to C3 continuously adjacent in the row direction, respectively. The three magnetic pillars 10 continuously adjacent in the column direction are thereby connected to the pillar wires A1 to A3, B1 to B3, or C1 to C3, respectively.

Figure 9:
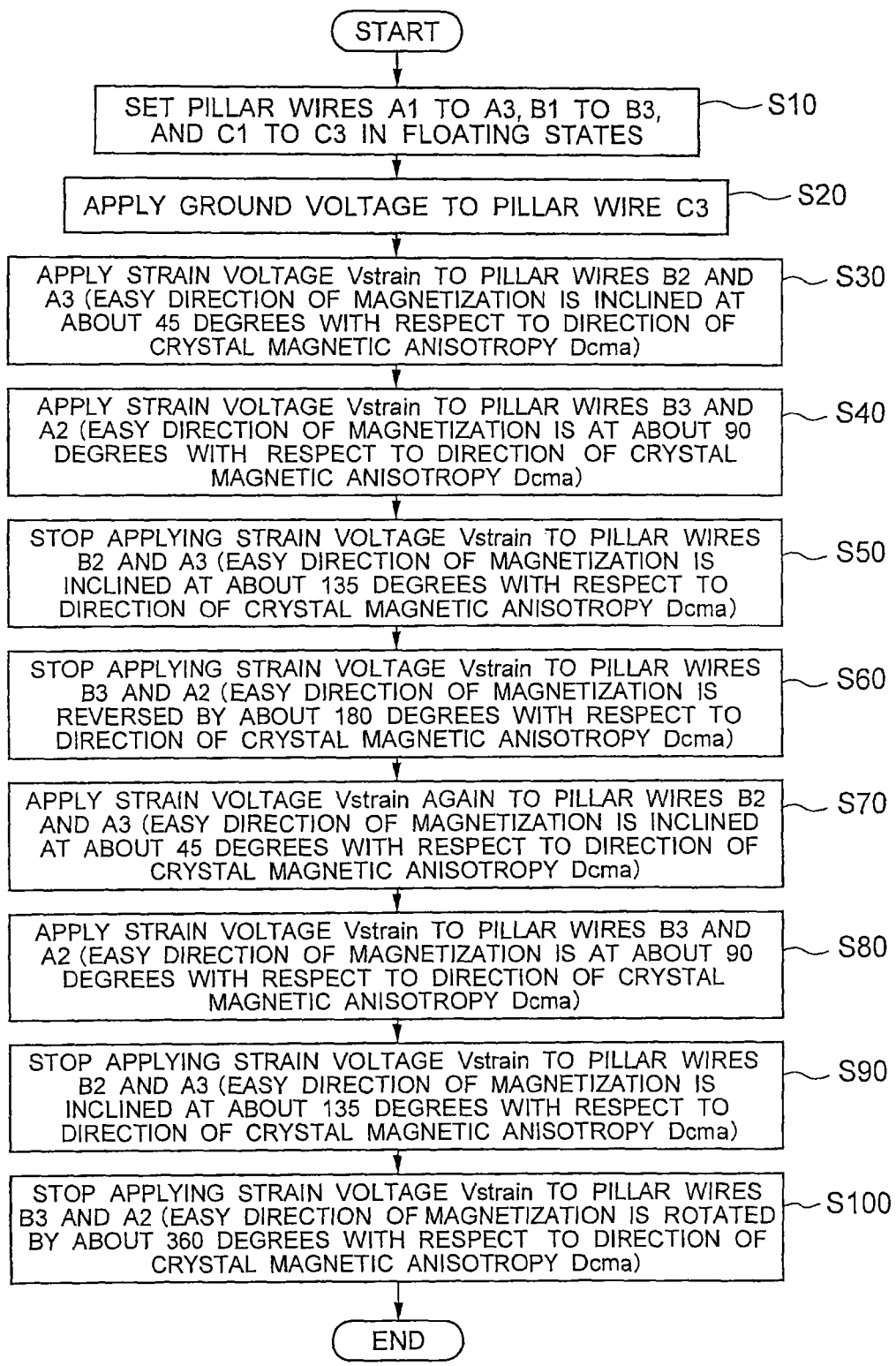
FIG. 9 is a flowchart showing the operation performed by the shift register memory according to the first embodiment.

FIG. 9 is a flowchart showing the operation performed by the shift register memory according to the first embodiment. FIG. 9 shows the operation for transferring the magnetization state of a magnetic pillar 10t. Furthermore, it is assumed that the direction of the crystal magnetic anisotropy Dcma of the magnetic pillar 10t is the same as the column direction.

First, all the cell transistors CT are turned off, and all the pillar wires A1 to A3, B1 to B3, and C1 to C3 are set in floating states (S10). In this state, the easy direction of magnetization (direction of the synthetic magnetic anisotropy Dsma) of each magnetic pillar 10 is the same as the direction of the crystal magnetic anisotropy Dcma.

Next, a ground voltage (0 V, for example) is applied to the pillar wire C3 (S20).

A strain voltage Vstrain is applied to the pillar wires B2 and A3 (S30). Either a positive voltage or a negative voltage can be used as the Vstrain. The stress application film 50 of each of magnetic pillars 10st_1, 10st_2, and 10t thereby applies the stress to the magnetic pillar 10t from a direction of 60 degrees aslant with respect to the column direction. Although either a tensile stress or a compression stress can be used as the stress at this time, it is preferable to use the compression stress. This is intended to avoid separating an interface between each stress application film 50 and the corresponding magnetic pillar 10 by the stress even if the stress application film 50 is not sufficiently closely attached to the magnetic pillar 10.

At this time, the easy direction of magnetization of each magnetic layer 20 of the magnetic pillar 10t is inclined at about 45 degrees with respect to the direction of the crystal magnetic anisotropy Dcma, similarly to the state shown in FIG. 4B.

Next, the strain voltage Vstrain is applied to the pillar wires B3 and A2 while maintaining the strain voltage Vstrain of the pillar wires B2 and A3 (S40). The stress application film 50 of each of magnetic pillars 10st_1, 10st_2, 10st_3, 10st_4, and 10t thereby applies the stress to the magnetic pillar 10t from a direction of 60 degrees or 120 degrees aslant with respect to the column direction.

At this time, the easy direction of magnetization of each magnetic layer 20 of the magnetic pillar 10t is inclined at about 90 degrees with respect to the direction of the crystal magnetic anisotropy Dcma, similarly to the state shown in FIG. 4C.

The application of the strain voltage Vstrain to the pillar wires B2 and A3 stops while maintaining the strain voltage Vstrain of the pillar wires B3 and A2 (S50). The stress application film 50 of each of the magnetic pillars 10st_3, 10st_4, and 10t thereby applies the stress to the magnetic pillar 10t from a direction of 120 degrees aslant with respect to the column direction.

At this time, the easy direction of magnetization of each magnetic layer 20 of the magnetic pillar 10t is inclined at about 135 degrees with respect to the direction of the crystal magnetic anisotropy Dcma, similarly to the state shown in FIG. 4D.

The application of the strain voltage Vstrain to the pillar wires B3 and A2 stops (S60). The easy direction of magnetization of each magnetic layer 20 of the magnetic pillar 10t is thereby reversed by about 180 degrees with respect to the direction of the crystal magnetic anisotropy Dcma, similarly to the state shown in FIG. 4E.

Next, the strain voltage Vstrain is applied again to the pillar wires B2 and A3 (S70). The easy direction of magnetization of each magnetic layer 20 of the magnetic pillar 10t is thereby inclined at about 45 degrees with respect to the direction of the crystal magnetic anisotropy Dcma.

The strain voltage Vstrain is then applied to the pillar wires B3 and A2 while maintaining the strain voltage Vstrain of the pillar wires B2 and A3 (S80). The easy direction of magnetization of each magnetic layer 20 of the magnetic pillar 10t is thereby at about 90 degrees with respect to the direction of the crystal magnetic anisotropy Dcma.

Subsequently, the application of the strain voltage Vstrain to the pillar wires B2 and A3 stops while maintaining the strain voltage Vstrain of the pillar wires B3 and A2 (S90). The easy direction of magnetization of each magnetic layer 20 of the magnetic pillar 10t is thereby inclined at about 135 degrees with respect to the direction of the crystal magnetic anisotropy Dcma.

Next, the application of the strain voltage Vstrain to the pillar wires B3 and A2 stops (S100). The easy direction of magnetization of each magnetic layer 20 of the magnetic pillar 10t thereby is rotated by about 360 degrees with respect to the direction of the crystal magnetic anisotropy Dcma. That is, the direction of magnetization of each magnetic layer 20 of the magnetic pillar 10t is also fully rotated once by the Steps S10 to S100. The data within the magnetic pillar 10t is thereby transferred to the MTJ element. Alternatively, the data stored in the MTJ element can be transferred to the magnetic pillar 10t.

The read or write operation for reading or writing the data transferred to or from the MTJ element is performed by driving the word line WL corresponding to the cell transistor CT connected to the magnetic pillar 10t. The cell transistor CT thereby electrically connects the MTJ element present, which is on the lower end of the magnetic pillar 10t, between one bit line BL and the pillar wire C3. As a result, the sense amplifier SA can detect the data in the MTJ element via the bit line BL or the pillar wire C3. Alternatively, the write driver WD can write the data to the magnetic pillar 10t via the bit line BL or the pillar wire C3.

The shift register memory according to the first embodiment can transfer magnetization information along the magnetic pillars 10 by the stress applied to the magnetic pillars 10 without providing a control electrode per bit or per shift. This can ensure shifting bits even if the number of bits included in each magnetic pillar 10 increases. Therefore, the shift register memory according to the first embodiment is low in a bit unit price and high in reliability.

In the first embodiment, it suffices to use the static magnetic field in the fixed direction because the magnetization information is transferred by using the stress applied to each of the magnetic pillars 10. That is, according to the first embodiment, there is no need to individually generate a current-induced magnetic field for each magnetic pillar 10. There is no need to consume a current for generating the magnetic field as long as the fixed magnet is used for generating the static magnetic field. Moreover, because the stress application film 50 is a voltage-driven element in principle, the current consumption is very low as compared with the current necessary to generate the rotating magnetic field. The shift register memory according to the first embodiment can thereby suppress the current consumption to be low even if the magnetic pillars 10 are downscaled.

In each of the magnetic pillars 10, the number of continuous pairs of the magnetic layers 20 in the same magnetization state can be used as data. For example, it can be defined as follows. A case where three pairs of magnetic layers 20 are continuous and the same in the magnetization state (three-shift continuity) is data "00", and a case where four pairs are continuous and the same in the magnetization state (four-shift continuity) is data "01". A case where five pairs are continuous and the same in the magnetization state (five-shift continuity) is data "10", and six pairs are continuous and the same in the magnetization state (six-shift continuity) is data "11".

Second Embodiment

Figure 10:
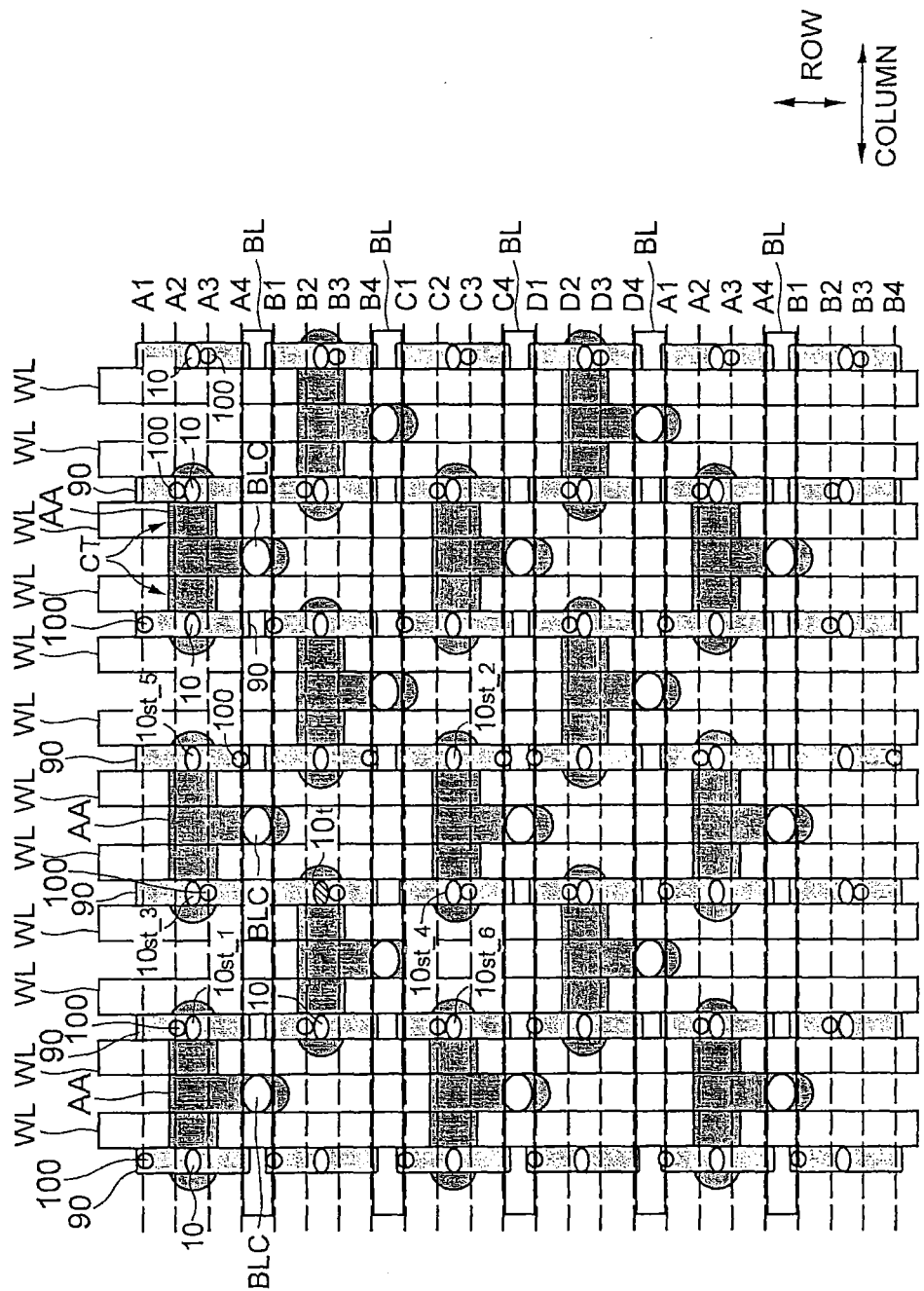
FIG. 10 is a plan view showing a layout of a shift register memory according to a second embodiment.

FIG. 10 is a plan view showing a layout of a shift register memory according to a second embodiment. In the second embodiment, the magnetic pillars 10 are smaller in diameter than the magnetic pillars 10 according to the first embodiment. Accordingly, each magnetic pillar 10 is connected to the contact 100 via a strap electrode 90. The magnetic pillars 10 are arranged two-dimensionally in a matrix. Therefore, the adjacent columns of the magnetic pillars 10 are not staggered but uniform in the row and column directions. Furthermore, the MTJ element present on the lower end of each of the magnetic pillars 10 is directly connected to the other end of the cell transistor CT without via the contact 120.

The magnetic pillars 10 have one-to-one correspondence to the strap electrodes 90. Each magnetic pillar 10 is electrically connected to one of pillar wires A1 to A4, B1 to B4, C1 to C4, or D1 to D4 via the strap electrode 90 and the contact 100.

The pillar wires A1 to A4, B1 to B4, C1 to C4, and D1 to D4 indicated by broken lines in the column direction are provided to correspond to the columns each configured by a plurality of contacts 100, respectively. The pillar wires A1 to A4, B1 to B4, C1 to C4, and D1 to D4 are connected to the contacts 100 in the corresponding columns, respectively.

As for a plurality of strap electrodes 90 arrayed in the row direction, positions of the contacts 100 relative to the strap electrodes 90 are the same. As for a plurality of strap electrodes 90 arrayed in the column direction, however, the positions of the contacts 100 relative to the strap electrodes 90 are staggered in the row direction. For example, the four contacts 100 are arranged at positions of intersections between the four strap electrodes 90 continuously adjacent in the column direction and the four pillar wires A1 to A4 continuously adjacent in the row direction, respectively. Similarly, the contacts 100 are arranged at positions of intersections between the four strap electrodes 90 continuously adjacent in the column direction and the four pillar wires B1 to B4 continuously adjacent in the row direction, respectively. Furthermore, the contacts 100 are arranged at positions of intersections between the four strap electrodes 90 continuously adjacent in the column direction and the four pillar wires C1 to C4 continuously adjacent in the row direction, respectively. The contacts 100 are arranged at positions of intersections between the four strap electrodes 90 continuously adjacent in the column direction and the four pillar wires D1 to D4 continuously adjacent in the row direction, respectively. The four magnetic pillars 10 continuously adjacent in the column direction are thereby connected to the pillar wires A1 to A4, B1 to B4, C1 to C4, or D1 to D4 which are different with each other, respectively.

The strap electrodes 90 can be eliminated if the diameter of each of the magnetic pillars 10 is large and the pillar wires A1 to A4, B1 to B4, C1 to C4, and D1 to D4 corresponding to the respective magnetic pillars 10 can be directly connected to the contacts 100 similarly to the first embodiment.

Other configurations of the memory according to the second embodiment can be identical to corresponding ones of the memory according to the first embodiment.

Figure 11:
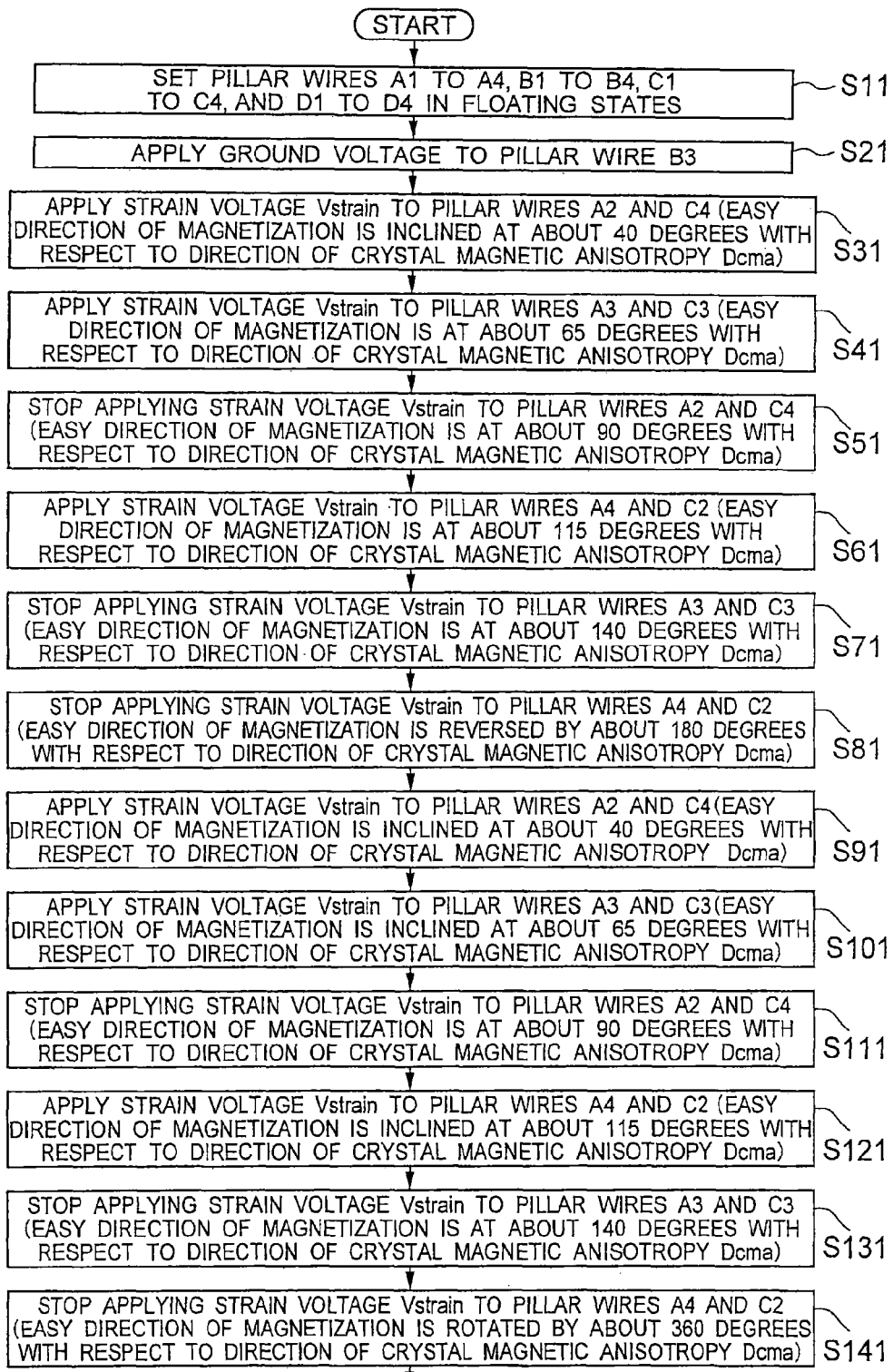
FIG. 11 is a flowchart showing an operation performed by the shift register memory according to the second embodiment.

FIG. 11 is a flowchart showing an operation performed by the shift register memory according to the second embodiment. FIG. 11 shows the operation for transferring the magnetization state of the magnetic pillar 10t shown in FIG. 10. Furthermore, it is assumed that the direction of the crystal magnetic anisotropy Dcma of the magnetic pillar 10t is the same as the column direction.

First, all the cell transistors CT are turned off, and all the pillar wires A1 to A4, B1 to B4, C1 to C4, and D1 to D4 are set in floating states (S11). In this state, the easy direction of magnetization (the direction of the synthetic magnetic anisotropy Dsma) of each magnetic pillar 10 is the same as the direction of the crystal magnetic anisotropy Dcma.

Next, the ground voltage (0 V, for example) is applied to the pillar wire B3 (S21).

The strain voltage Vstrain is applied to the pillar wires A2 and C4 (S31). Either the positive voltage or the negative voltage can be used as the Vstrain. The stress application film 50 of each of the magnetic pillars 10st_1, 10st_2, and 10t applies the stress to the magnetic pillar 10t from a direction of 45 degrees aslant with respect to the column direction. Either the tensile stress or the compression stress can be used as the stress at this time.

At this time, the easy direction of magnetization of each magnetic layer 20 of the magnetic pillar 10t is inclined at about 40 degrees with respect to the direction of the crystal magnetic anisotropy Dcma.

Next, the strain voltage Vstrain is applied to the pillar wires A3 and C3 while maintaining the strain voltage Vstrain of the pillar wires A2 and C4 (S41). The stress application film 50 of each of the magnetic pillars 10st_1, 10st_2, 10st_3, 10st_4, and 10t thereby applies the stress to the magnetic pillar 10t from a direction of 70 degrees aslant with respect to the column direction.

At this time, the easy direction of magnetization of each magnetic layer 20 of the magnetic pillar 10t is inclined at about 65 degrees with respect to the direction of the crystal magnetic anisotropy Dcma.

Subsequently, the application of the strain voltage Vstrain to the pillar wires A2 and C4 stops while maintaining the strain voltage Vstrain of the pillar wires A3 and C3 (S51). The stress application film 50 of each of the magnetic pillars 10st_3, 10st_4, and 10t thereby applies the stress to the magnetic pillar 10t from a direction of 90 degrees aslant with respect to the column direction.

At this time, the easy direction of magnetization of each magnetic layer 20 of the magnetic pillar 10t is inclined at about 90 degrees with respect to the direction of the crystal magnetic anisotropy Dcma.

Next, the strain voltage Vstrain is applied to the pillar wires A4 and C2 while maintaining the strain voltage Vstrain of the pillar wires A3 and C3 (S61). The stress application film 50 of each of magnetic pillars 10st_3 to 10st_6 and 10t thereby applies the stress to the magnetic pillar 10t from a direction of 110 degrees aslant with respect to the column direction. The easy direction of magnetization of each magnetic layer 20 of the magnetic pillar 10t is thereby at about 115 degrees with respect to the direction of the crystal magnetic anisotropy Dcma.

Subsequently, the application of the strain voltage Vstrain to the pillar wires A3 and C3 stops while maintaining the strain voltage Vstrain of the pillar wires A4 and C2 (S71). The stress application film 50 of each of the magnetic pillars 10st_5, 10st_6, and 10t thereby applies the stress to the magnetic pillar lot from a direction of 135 degrees aslant with respect to the column direction. The easy direction of magnetization of each magnetic layer 20 of the magnetic pillar 10t is thereby inclined at about 140 degrees with respect to the direction of the crystal magnetic anisotropy Dcma.

Next, the application of the strain voltage Vstrain to the pillar wires A4 and C2 stops (S81). The easy direction of magnetization of each magnetic layer 20 of the magnetic pillar 10t is thereby reversed by about 180 degrees with respect to the direction of the crystal magnetic anisotropy Dcma.

The strain voltage Vstrain is then applied again to the pillar wires A2 and C4 (S91). The easy direction of magnetization of each magnetic layer 20 of the magnetic pillar 10t is thereby inclined at about 40 degrees again with respect to the direction of the crystal magnetic anisotropy Dcma.

Next, the strain voltage Vstrain is applied to the pillar wires A3 and C3 while maintaining the strain voltage Vstrain of the pillar wires A2 and C4 (S101). The easy direction of magnetization of each magnetic layer 20 of the magnetic pillar 10t is thereby inclined at about 65 degrees again with respect to the direction of the crystal magnetic anisotropy Dcma.

Subsequently, the application of the strain voltage Vstrain to the pillar wires A2 and C4 stops while maintaining the strain voltage Vstrain of the pillar wires A3 and C3 (S111). The easy direction of magnetization of each magnetic layer 20 of the magnetic pillar 10t is thereby inclined at about 90 degrees again with respect to the direction of the crystal magnetic anisotropy Dcma.

The strain voltage Vstrain is then applied to the pillar wires A4 and C2 while maintaining the strain voltage Vstrain of the pillar wires A3 and C3 (S121). The easy direction of magnetization of each magnetic layer 20 of the magnetic pillar 10t is thereby inclined at about 115 degrees again with respect to the direction of the crystal magnetic anisotropy Dcma.

Next, the application of the strain voltage Vstrain to the pillar wires A3 and C3 stops (S131). The easy direction of magnetization of each magnetic layer 20 of the magnetic pillar 10t is thereby inclined at about 140 degrees again with respect to the direction of the crystal magnetic anisotropy Dcma.

Subsequently, the application of the strain voltage Vstrain to the pillar wires A4 and C2 stops (S141). The easy direction of magnetization of each magnetic layer 20 of the magnetic pillar 10t is thereby rotated by about 360 degrees with respect to the direction of the crystal magnetic anisotropy Dcma. That is, the direction of magnetization of each magnetic layer 20 of the magnetic pillar 10t is also rotated by 360 degrees by the Steps S11 to S141. The data within the magnetic pillar 10t is thereby transferred to the MTJ element. Alternatively, the data stored in the MTJ element can be transferred to the magnetic pillar 10t.

The read or write operation for reading or writing the data transferred to or from the MTJ element is the same as that according to the first embodiment and therefore is not described herein.

Third Embodiment

FIG. 12 is a perspective view showing a configuration of a shift register memory according to a third embodiment. In the third embodiment, each magnetic pillar 10 is provided in a hole 130 formed in the interlayer dielectric film ILD. A gap is present between the magnetic pillar 10 and an inner wall of the hole 130. An upper end of the magnetic pillar 10 is formed so as to roll along an opening of the hole 130. The magnetic pillar 10 can thereby pivotally rotate like a spinning top with a lower end 15 used as a fulcrum.

Magnets 140 for applying the static magnetic field to the magnetic pillar 10 are arranged on both side surfaces of the hole 130, respectively. Either permanent magnets or electromagnets can be used as the respective magnets 140. Furthermore, electrodes 150 are provided at the opening of the hole 130. The ground voltage is applied to the fulcrum 15 of the magnetic pillar 10. Therefore, when a voltage is applied to the electrodes 150 in an order along an arrow A1, the magnetic pillar 10 operates to roll along the opening of the hole 130 by a voltage difference between the magnetic pillar 10 and each of the electrodes 150. The magnetic pillar 10 thereby rotates in a direction of an arrow A2 opposite to that of the arrow A1.

In this way, according to the third embodiment, the magnetic pillar 10 physically rotates (revolves on the fulcrum 15) per se with respect to the static magnetic field within the hole 13. It is thereby possible to rotate the easy direction of magnetization of each magnetic layer 20 relatively to the static magnetic field.

According to the third embodiment, there is no need to apply the stress to the magnetic pillar 10. Therefore, it is unnecessary to provide the stress application film 50, whereby process temperature can be suppressed to be low in manufacturing process. As a result, the flexibility for designing peripheral circuits increases and the shift register memory can be accelerated. The shift register memory according to the third embodiment can be easily manufactured by using a method of manufacturing an MEMS (Micro Electro Mechanical System).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A shift register memory comprising:
a magnetic pillar comprising a plurality of magnetic layers and a plurality of nonmagnetic layers provided between the magnetic layers adjacent to each other;
a stress application part configured to apply a stress to the magnetic pillar while magnetization states of the magnetic layers are transferred in a stacking direction of the magnetic layers; and
a magnetic-field application part applying a static magnetic field to the magnetic pillar.

2. The memory of claim 1, further comprising a sense element provided on one end of the magnetic pillar, the sense element detects the magnetization states transferred within the magnetic pillar.

3. The memory of claim 1, wherein an easy direction of magnetization of the magnetic layers within the magnetic pillar rotates by applying the stress to the magnetic pillar.

4. The memory of claim 2, wherein an easy direction of magnetization of the magnetic layers within the magnetic pillar rotates by applying the stress to the magnetic pillar.

5. The memory of claim 1, wherein the stress application part is formed by using a ferroelectric film provided around the magnetic pillar.

6. The memory of claim 2, wherein the stress application part is formed by using a ferroelectric film provided around the magnetic pillar.

7. The memory of claim 3, wherein the stress application part is formed by using a ferroelectric film provided around the magnetic pillar.

8. The memory of claim 2, wherein the sense element is a magnetic tunnel junction element.

9. The memory of claim 1, wherein
a plurality of the magnetic pillars are arranged,
the stress application part is respectively provided around the magnetic pillars, and
the stress application part applies the stress to the magnetic pillars by an electric field generated by applying a voltage to the magnetic pillars.

10. The memory of claim 2, wherein
a plurality of the magnetic pillars are arranged,
the stress application part is respectively provided around the magnetic pillars, and
the stress application part applies the stress to the magnetic pillars by an electric field generated by applying a voltage to the magnetic pillars.

11. The memory of claim 3, wherein
a plurality of the magnetic pillars are arranged,
the stress application part is respectively provided around the magnetic pillars, and
the stress application part applies the stress to the magnetic pillars by an electric field generated by applying a voltage to the magnetic pillars.

12. The memory of claim 5, wherein
a plurality of the magnetic pillars are arranged,
the stress application part is respectively provided around the magnetic pillars, and
the stress application part applies the stress to the magnetic pillars by an electric field generated by applying a voltage to the magnetic pillars.

13. The memory of claim 9, wherein
the magnetic-field application part is a permanent magnet or a ferromagnetic material, filled between the adjacent magnetic pillars.

14. The memory of claim 1, further comprising a diffusion suppression film provided between the magnetic pillar and the stress application part, the diffusion suppression film suppressing diffusion of a material of the magnetic layers and a material of the stress application part.

15. The memory of claim 9, wherein
the magnetic pillars arranged in a first direction constitute pillar columns, and
positions of the magnetic pillars in a plurality of the pillar columns adjacent to each other are shifted by a half pitch of a total width of the magnetic pillar and a space between two magnetic pillars adjacent to each other in the first direction.

16. The memory of claim 9, wherein the magnetic pillars are arranged two-dimensionally in a matrix.

17. A method of driving a shift register memory, the shift register memory comprising: a magnetic pillar comprising a plurality of magnetic layers and a plurality of nonmagnetic layers provided between the magnetic layers adjacent to each other; a stress application part applying a stress to the magnetic pillar; and a magnetic-field application part applying a static magnetic field to the magnetic pillar, the method comprising:

transferring the magnetization states of the magnetic layers in a stacking direction of the magnetic layers by applying the stress to the magnetic pillar.

18. The method of claim 17, wherein the transference of the magnetization states of the magnetic layers is executed by rotating an easy direction of magnetization of the magnetic layers within the magnetic pillar by an inverse magnetostriction effect which is produced by applying the stress to the magnetic pillar.

19. The method of claim 17, wherein magnetic pillars are arranged, the stress application part is respectively provided around the magnetic pillars, and the transference of the magnetization states of the magnetic layers is executed by applying the stress to the magnetic pillars by an electric field which is generated by applying a voltage to the magnetic pillars.

20. The method of claim 18, wherein magnetic pillars are arranged, the stress application part is respectively provided around the magnetic pillars, and the transference of the magnetization states of the magnetic layers is executed by applying the stress to the magnetic pillars by an electric field which is generated by applying a voltage to the magnetic pillars.

* * * * *